United States Patent [19]

Jordan

[11] Patent Number: 5,283,515
[45] Date of Patent: Feb. 1, 1994

[54] AUTOMATIC CALIBRATION SYSTEM FOR A RAMP VOLTAGE GENERATOR

[75] Inventor: Edward P. Jordan, Greensboro, N.C.

[73] Assignee: Analog Devices, Inc., Norwood, Mass.

[21] Appl. No.: 890,950

[22] Filed: May 29, 1992

[51] Int. Cl.⁵ .............................................. H03K 4/08
[52] U.S. Cl. ................................. 323/288; 307/228; 328/185
[58] Field of Search ............... 323/282, 288; 307/228, 307/261, 263; 328/181, 184, 185

[56] References Cited

U.S. PATENT DOCUMENTS 3,949,393  4/1976  Bjornsen et al. .................... 328/185
4,490,653  12/1984  Olmstead ............................ 315/403
4,581,585  4/1986  Bristol ................................ 328/185

Primary Examiner—Emanuel T. Voeltz
Attorney, Agent, or Firm—Iandiorio & Dingman

[57] ABSTRACT

An automatic calibration for a ramp voltage generator includes a ramp voltage generator circuit responsive to a clock signal for providing a ramp voltage during a ramp voltage period; a comparator responsive to the ramp voltage for indicating whether the ramp voltage has reached a predetermined reference voltage level in the ramp voltage period; and a ramp rate control circuit responsive to the comparator for adjusting the ramp voltage generator circuit to drive the ramp voltage to obtain the predetermined reference voltage level in the ramp voltage period.

6 Claims, 3 Drawing Sheets

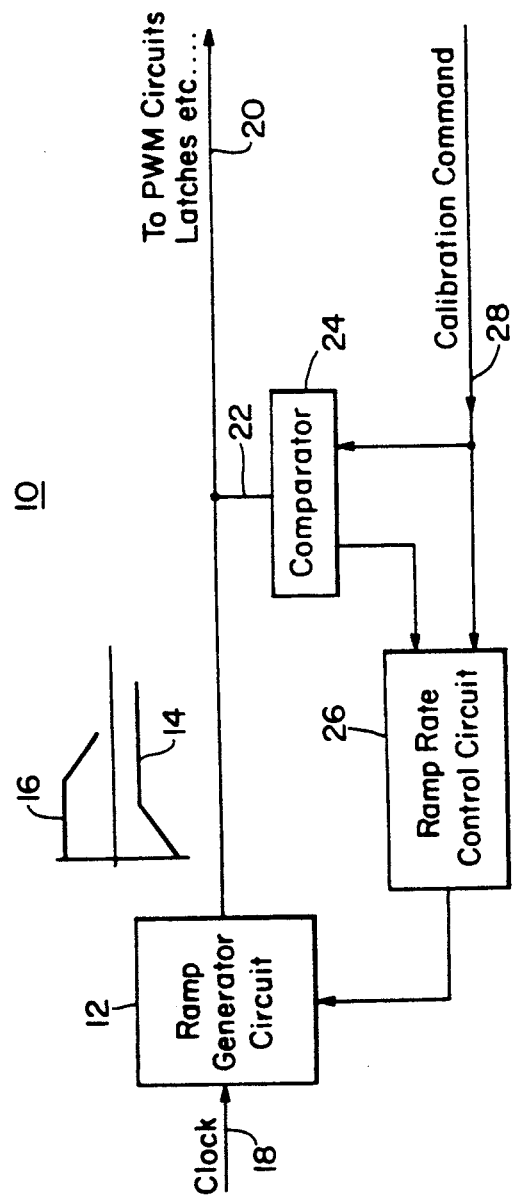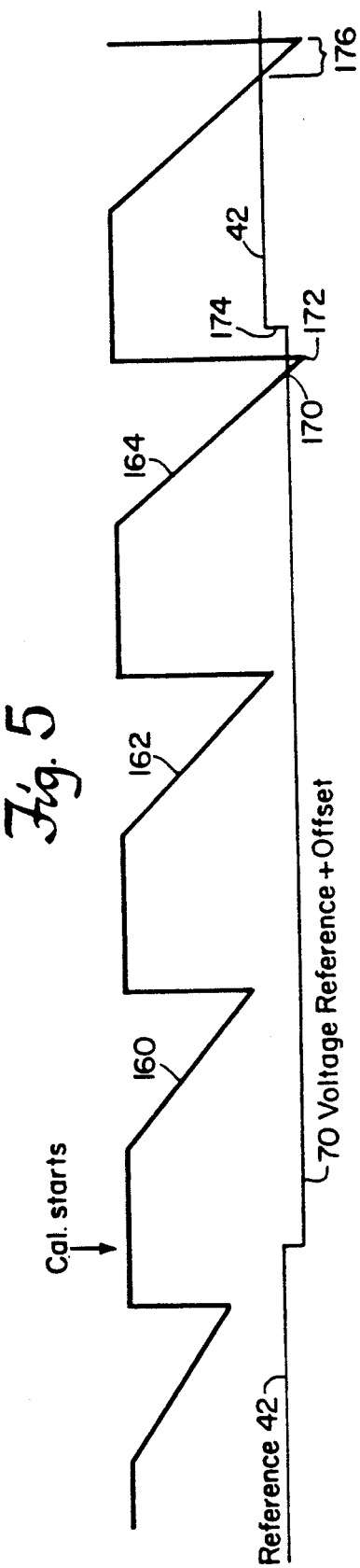

AUTOMATIC CALIBRATION SYSTEM FOR A RAMP VOLTAGE GENERATOR

FIELD OF INVENTION

This invention relates to an automatic calibration system for a ramp voltage generator, and more particularly to such a system which assures indications of ramp termination sufficiently substantial to trigger subsequent circuits such as pulse width modulation systems.

BACKGROUND OF INVENTION

Voltage ramp generators often used in pulse width modulation circuits are currently tuned to produce a positive or negative voltage ramp which terminates at the proper voltage within a designated time period by adjusting the current flow with a variable resistance or potentiometer. Such an approach has a number of shortcomings. The adjustment is a one-time operation usually done at the factory. Any shifts due to subsequent aging, temperature, power or impedance variations can only be accommodated by a qualified technician with attendant delays and costs. In addition, the potentiometer is basically a mechanical device and suffers from unreliability due to wear and contamination. Further the human involvement introduces the vagaries of subjective judgment. Another technique views the output pulses, such as from a pulse width modulation circuit, to determine whether the pulses meet predetermined width requirements and feeds back signals to adjust the ramp voltage until pulses of the proper width are produced. This can be done by monitoring the time from ramp initiation to pulse output or measuring the pulse width against the desired pulse width duty cycle. These approaches are slow and require more complicated implementation including a number of additional components such as an integrator and a window comparator.

SUMMARY OF INVENTION

It is therefore an object of this invention to provide an automatic calibration system for a ramp voltage generator.

It is a further object of this invention to provide such an automatic calibration system which is faster, more accurate and consistent.

It is a further object of this invention to provide such an automatic calibration system which is simpler to use, less complicated in design, and easily adjusted frequently, continuously, and without human participation.

It is a further object of this invention to provide such an automatic calibration system which assures a strong reliable signal indicating the end of the ramp voltage.

The invention results from the realization that a truly automatic, fast and accurate yet simple and reliable ramp voltage calibration system can be achieved by comparing the generated ramp voltage itself to a predetermined reference voltage, noting any divergence between the two, and feeding back an adjustment signal to converge the ramp voltage with the reference voltage, and from the further realization that the inherently unreliable pulse created when the ramp voltage just reaches the predetermined reference voltage can be avoided by applying, instead of the desired predetermined reference voltage, a second reference voltage which is beyond the predetermined reference voltage so that a strong, reliable ramp voltage termination indicator is created, after which that second reference voltage is ignored and the system reverts to responding to the predetermined reference voltage.

This invention features an automatic calibration system for a ramp voltage generator having a ramp voltage generator circuit responsive to a clock signal for providing a ramp voltage in a ramp voltage period and comparator means responsive to the ramp voltage for indicating whether the ramp voltage has reached a predetermined reference voltage level in the ramp voltage period. A ramp rate control circuit responsive to the comparator means adjusts the ramp voltage generator circuit to drive the ramp voltage to converge with the predetermined reference voltage level in the ramp voltage.

In a preferred embodiment the comparator means includes means for driving the ramp voltage to a reference voltage level beyond the predetermined reference voltage level. The means for driving may include a voltage reference circuit for defining the voltage reference level beyond the predetermined reference voltage level, and the comparator means may further include a comparator circuit responsive to the voltage reference circuit and the ramp voltage. The means for driving may include a voltage reference circuit for defining the predetermined reference voltage level, an offset circuit for providing an additional voltage level, and switching means for selectively combining the predetermined reference voltage level and the additional voltage level to provide for the comparator circuit the reference voltage level beyond the predetermined reference voltage level. The ramp rate control means may include counter means for storing a count representative of a desired ramp voltage, means for stepping the counter in response to the comparator means indicating that the ramp voltage did not reach the reference voltage level beyond the predetermined reference voltage level, and a digital to analog converter responsive to the counter means for modifying the rate of the ramp voltage to converge with the reference voltage level beyond the predetermined reference voltage level.

The invention also features an automatic calibration system for a ramp voltage generator which includes a ramp voltage generator circuit responsive to a clock signal for providing a ramp voltage during a ramp voltage period. Comparator means, responsive to the ramp and a reference voltage level, indicates whether the ramp voltage has reached a predetermined reference voltage in the ramp voltage period. There are mean for receiving a calibration command, and a ramp rate control circuit enabled by the calibration command is provided to adjust the ramp voltage generator circuit to drive the ramp voltage to converge on the predetermined reference voltage level. Gate means, enabled by the calibration command and responsive to the comparator means indicating that the ramp voltage has not reached the reference voltage level, delivers an adjustment signal to the ramp rate control circuit to adjust the ramp voltage generator circuit.

The invention also features an automatic calibration system for calibrating a ramp voltage generator to a predetermined reference voltage level. There is a ramp voltage generator circuit responsive to a clock signal for providing a ramp voltage during a ramp voltage period. Comparator means, responsive to the ramp voltage and a second reference voltage level beyond the predetermined reference voltage level, indicates whether the ramp voltage has reached the second reference voltage level. There are means for receiving a calibration command. A ramp rate control circuit is enabled by the calibration command to adjust the ramp voltage generator circuit to drive the ramp voltage to converge on the predetermined reference voltage level. Gate means, enabled by the calibration command and responsive to the comparator means indicating that the ramp voltage has not reached the reference voltage level, delivers an adjustment signal to the ramp rate control circuit to adjust the ramp voltage generator circuit.

DISCLOSURE OF PREFERRED EMBODIMENT

Other objects, features and advantages will occur to those skilled in the art from the following description of a preferred embodiment and the accompanying drawings, in which:

FIG. 1 is a functional block diagram of an automatic calibration system according to this invention;

Figure 4:
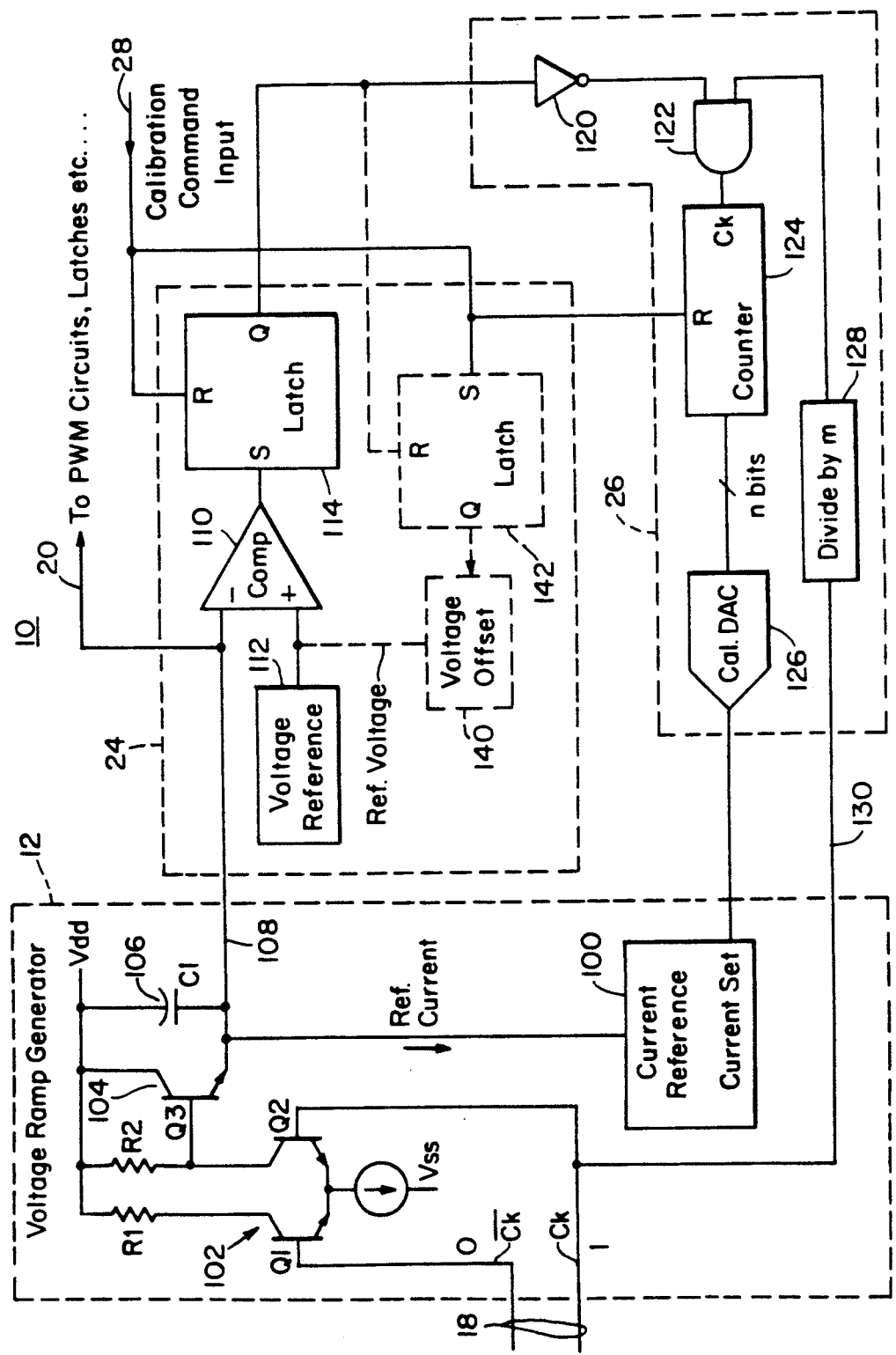
Figure 2A:
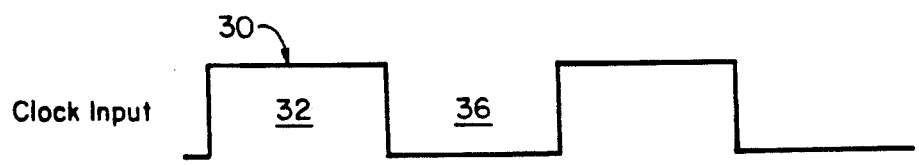
FIG. 2A depicts a clock signal used in FIG. 1.
Figure 2B:
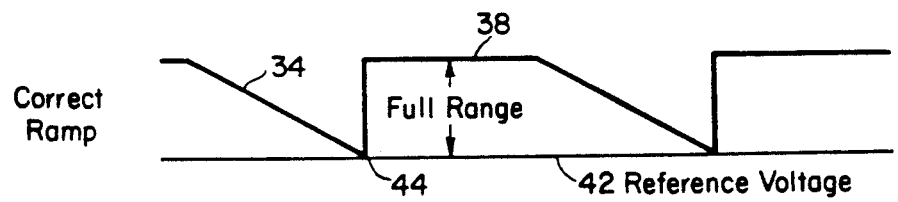
Figure 3:
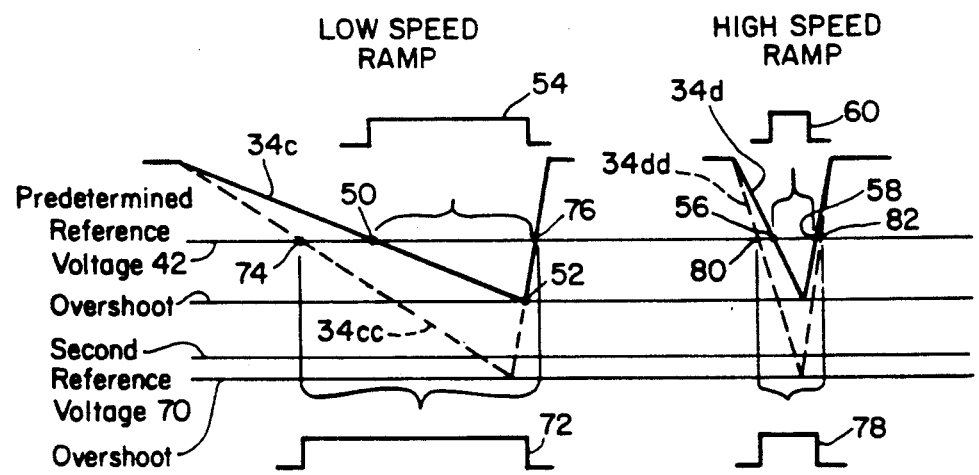

FIGS. 2B, C and D show the ramp voltage under normal, excessive and insufficient ramp current conditions;

FIG. 3 depicts the ramp voltage generated at low speed and high speed, indicating the relative size of pulses that can be generated by the overshoot between the desired predetermined reference voltage and the second reference voltage beyond the predetermined reference voltage;

FIG. 4 is a more detailed schematic diagram of the automatic calibration system of FIG. 1; and FIG. 5 is an abridged depiction of a series of waveforms which occur in the system of FIG. 4.

An automatic calibration system for a voltage ramp generator can be accomplished according to this invention using a ramp generator circuit which is responsive to a clock signal for providing a ramp voltage during a ramp voltage period. The ramp voltage period is defined with reference to the clock signal and may include the entire portion of the clock signal, half of it (for example the positive-going or negative-going half), or some other portion of the clock signal. A comparator responsive to the ramp voltage and to a predetermined reference voltage, indicates whether the ramp voltage has reached a predetermined reference voltage level during the designated ramp voltage period. A ramp rate control circuit which is responsive to the comparator adjusts the ramp voltage generator circuit to drive the ramp voltage to converge with the predetermined reference voltage level in the ramp voltage period.

In order to assure that the overshoot of the ramp voltage with respect to the predetermined reference voltage will provide a sufficient pulse to trigger subsequent circuits, the comparator may include means for driving the ramp voltage to a second reference voltage level beyond the predetermined reference voltage level. The means for driving may include a second voltage circuit which defines a second voltage reference level beyond the predetermined reference voltage level, and the comparator may include a comparator circuit which responds to the second voltage reference circuit and the ramp voltage. Alternatively, the means for driving may include a voltage reference circuit for defining a predetermined reference voltage level, and an offset circuit for providing an additional voltage level. In that case, switching means or a latch may be used to selectively combine the predetermined reference voltage level and the additional voltage level to provide for the comparator circuit the second reference voltage level which is beyond the predetermined reference voltage level. The ramp rate control can include a counter for storing a count representative of a desired ramp voltage. There are means for stepping the counter in response to the comparator means, indicating that the ramp voltage did not reach the second reference voltage level, and there is a digital to analog converter responsive to the counter means for modifying the rate of the ramp voltage to converge with the second reference voltage level beyond the predetermined reference voltage level.

There is shown in FIG. 1 an automatic calibration system 10 according to this invention which includes a ramp generator circuit 12 that creates a ramp, either positive-going 14 or negative-going 16, in response to a clock signal 18. Normally the ramp signals are delivered on output line 20 to subsequent circuits such as pulse width modulation circuits, latches or the like. The output ramp in accordance with this invention, however, is accessible on line 22 to a comparator 24. Comparator 24 compares the ramp voltage to a predetermined reference voltage to determine whether the ramp has reached its terminal voltage in the designated ramp voltage period. If it has not, the ramp rate control circuit is driven to adjust the current flow in ramp generator circuit 12 to adjust the ramp rate so that the proper voltage is reached. Normally the system operates in the ramp generation mode and is only switched to the calibration mode by the occurrence of a calibration command on line 28.

The need for calibration can be seen with respect to FIGS. 2A, B, C and D. FIG. 2A shows clock signal 30 which appears on line 18 of FIG. 1. In this particular instance the ramp voltage period is defined as the positive portion 32 of clock signal 30. During this period a negative-going ramp 34, FIG. 2B, is generated. During the negative portion 36 of the clock signal no ramp is generated and the ramp output remains at level 38, FIG. 2B. Typically, in a pulse width modulation application two ramp generators are used so that the second ramp generator would be providing a ramp during the negative portion 36 of the clock signal 30 when the output 38 is being provided by ramp generator circuit 12.

Figure 2C:
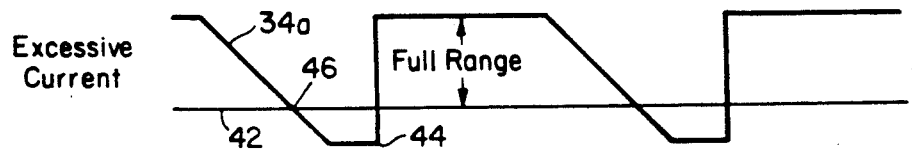
Figure 2D:
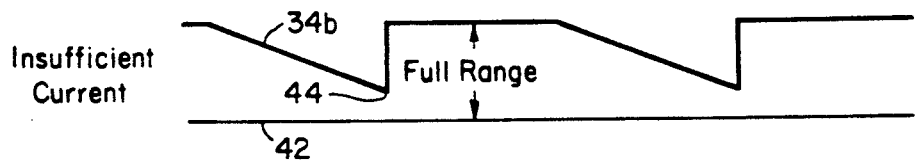

With the proper current flow in ramp generator circuit 12, ramp 34 terminates at point 44 upon reaching the predetermined reference voltage 42 within the designated ramp voltage period. However, if the current in ramp generator circuit 12 varies due to aging, temperature, variations in power supply, or some other cause, excessive current may flow which causes a steeper ramp 34a, FIG. 2C so that the terminal voltage is reached at point 46 long before the end of the ramp voltage period. In a similar manner, if insufficient current is provided, FIG. 2D, then a shallower ramp 34b is created and the period ends before the ramp voltage ever reaches the reference voltage 42.

An additional problem that occurs in such a calibration circuit is illustrated in FIG. 3, where it can be seen that there is an overshoot of the ramp from which is derived a pulse used to trigger subsequent circuits. When ramp 34c is a low-speed ramp, then it overshoots the reference voltage 42 for a substantial period of time from point 50 to point 76, which can be used to generate a generous pulse 54 sufficient to trigger subsequent circuits. However, a high-speed ramp, as indicated at 34d, has a much smaller overshoot between points 56 and 58 resulting in a much less substantial pulse 60 which in some cases is insufficient to fire subsequent circuits. In order to overcome this in accordance with one feature of this invention, a second reference voltage level 70 beyond the predetermined reference voltage 42, in this case more negative than reference voltage 42, is used as the reference for the comparator 24, FIG. 1. By using a second, greater reference voltage level 70, an even larger pulse 72 is generated by the low speed ramp 34cc between points 74 and 76 with respect to the predetermined reference voltage 42, and even with the high-speed ramp a substantial pulse 78 results from the overshoot between points 80 and 82. Since this scheme of employing a second reference voltage is only employed in the calibration mode, it does not affect the accuracy of the ramp with respect to the predetermined reference voltage level 42, and as can be seen in FIG. 3, there is sacrificed only a small portion of the ramp voltage period in order to obtain the overshoot condition with respect to the second reference voltage. However, the result is a much more accurate and consistent ramp voltage.

In one embodiment, ramp generator circuit 12, FIG. 4, includes a current reference circuit 100, differential switch 102, ramp control transistor 104, and ramp capacitor 106. Each time clock signal ck goes high, that is, attains a 1 level, and $\overline{ck}$ reaches the zero level, transistor Q2 in differential switch 102, turns on. This turns off transistor Q3 of switch 104 and enables capacitor 106 to provide a ramp current on line 108. Alternatively, when clock signals ck and $\overline{ck}$ interchange states, transistor Q3 conducts and shunts capacitor 106 so that the ramp is stopped. Comparator 24 includes a comparator circuit 110 which has as its negative input the ramp on 108 generated by capacitor 106. At its positive input it receives from the voltage reference circuit 112 a voltage reference level which is lower for a negative ramp and greater for a positive ramp than the predetermined voltage reference level. The output of comparator 110 is submitted to latch 114. Latch 114 is set by a signal from comparator 110 and is reset by a calibration command on line 28. Ramp rate control circuit 26 includes an inverter 120, and AND gate 122, counter 124, Which is also reset by a calibration command on line 28, and a calibrating digital to analog converter 126. There is also a divide by m circuit 128 which responds to clock signal ck on line 130 to enable AND gate 122 only once every m clock signals.

In operation, at any time when a calibration is desired, a calibration command is delivered on line 28 which resets latch 114 and counter 124. At that point the count delivered to DAC 126 is insufficient to provide a current flow necessary to produce a ramp on line 108 that will reach the necessary reference voltage level within the ramp voltage period. Therefore comparator 110 does not provide an input to set latch 114. The q output of latch 114 is therefore zero. Thus the output of converter 126 is the DAC's minimum output voltage, and one of the two inputs to AND gate 122 is therefore enabled and remains enabled as long as the ramp continues in its present condition, which it does until counter 124 is adjusted. After m clock pulses, the second enabling input to AND gate 122 is delivered by the divide by m circuit 128, and so counter 124 is stepped. This count is delivered to DAC 126 which generates an increased current flow in the current reference, steepening the ramp delivered on line 108 to comparator 110. This keeps up until the reference current is sufficient to effect a ramp which converges on the reference voltage level provided by voltage reference circuit 112 in the ramp voltage period. When that occurs, an output from comparator 110 sets latch 114 and switches its q output from 0 to 1. Thus inverter 120 now provides a zero on its input to AND gate 122. Thus the counter can no longer be stepped. The count in the counter is now frozen at the point necessary to keep the ramp at precisely the point desired. The DAC driven by this count consequently maintains the necessary current flow to keep the ramp in that condition. The counter could be a count up/down counter as opposed to just a count up counter. The counter would start at its midscale value and count up or count down. If it did not trigger the comparator when it started, it would count up. If it did trigger the comparator when it started, then it would count down until the comparator stopped outputting a pulse. At this point one count is added and the system would be calibrated.

The purpose of the divide by m circuit is primarily to ensure that there is enough time for the low-cost, slower counter 124 and DAC 126 to settle between cycles.

In an alternative construction of comparator 24, voltage reference circuit 112 may actually provide the predetermined reference voltage level. In that case a voltage offset circuit 140 and a second latch 142 is provided. Thus when a calibration command occurs on line 28, latch 142 is set and its q output causes the voltage offset in circuit 140 to be added to that predetermined voltage reference level provided by circuit 112 so that the total is the second reference voltage level which is beyond that of the predetermined voltage reference level. This adheres only so long as the calibration mode occurs, for as soon as the proper ramp condition is recognized by comparator 110 it switches latch 114 output q from zero to one and that q output is used to reset latch 142 and disable the voltage offset circuit 140. This construction is particularly desirable when comparator 110 also functions as a part of another circuit such as a pulse width modulation circuit which must operate normally at the predetermined voltage reference level and can only depart from that momentarily to operate at the second voltage reference level, which is beyond the predetermined voltage reference level, for a brief period during the calibration mode. This can be understood more readily with respect to FIG. 5.

When calibration starts, the voltage reference level 42 shifts to the voltage reference plus the offset to obtain the second reference voltage level 70. The ramp 160 is generated m times, after which counter 124 is stepped so that ramp 162 also generated m times, converges a little more closely to the second reference voltage level 70, after which counter 124 is stepped again to generate ramp 164. Ideally 164 should occur one time. The first time it occurs the comparators 112 should fire and latch 114 should be set. Ramp 164 is the first ramp to cross the second voltage reference level 70 at 170. The small overshoot 172 below the second voltage reference 70 is necessarily sufficient to operate comparator 110 and latch 114. Otherwise the system would continue to converge. However, as indicated before, that small overshoot 172 may be unreliable for operating other subsequent circuits. However, immediately after the signal derived from overshoot 172 ends the calibration mode, the reference voltage is shifted back to the predetermined voltage reference level 42 at point 174. This assures that all future pulses generated by comparator 112 are substantial as indicated by overshoot 176, and generate a pulse sufficient to operate subsequent circuits.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. An automatic calibration system providing an automatic calibration process for a ramp voltage generator comprising:
   a ramp voltage generator circuit responsive to a clock signal for providing a ramp voltage during a ramp voltage period;
   comparator means, responsive to the ramp voltage, for indicating whether the ramp voltage has reached a predetermined reference voltage level in said ramp voltage period; said comparator means including means for driving the ramp voltage to a second reference voltage level beyond said predetermined reference voltage level; and
   a ramp rate control circuit, responsive to said comparator means, for adjusting the ramp voltage generator circuit to drive the ramp voltage to converge with said predetermined reference voltage level in said ramp voltage period.

2. The automatic calibration system for a ramp voltage generator of claim 1 in which said means for driving includes a voltage reference circuit for defining said second voltage reference level beyond said predetermined reference voltage level and said comparator means further includes a comparator circuit responsive to said second voltage reference circuit and said ramp voltage.

3. The automatic calibration system for a ramp voltage generator of claim 1 in which said means for driving includes a voltage reference circuit for defining said predetermined reference voltage level, an offset circuit for providing an additional voltage level, and switching means for selectively combining said predetermined reference voltage level and said additional voltage level to provide for said comparator circuit said second reference voltage level beyond said predetermined reference voltage level.

4. The automatic calibration system for a ramp voltage generator of claim 1 in which said ramp rate control means includes counter means for storing a count representative of a desired ramp voltage, means for stepping said counter in response to said comparator means indicating that the ramp voltage did not reach said second reference voltage level beyond said predetermined reference voltage level, and a digital to analog converter, responsive to said counter means for modifying the rate of said ramp voltage to converge with said second reference voltage level beyond said predetermined reference voltage level.

5. An automatic calibration system providing an automatic calibration process for a ramp voltage generator comprising:
   a ramp voltage generator circuit responsive to a clock signal for providing a ramp voltage during a ramp voltage period;
   comparator means, responsive to the ramp and a reference voltage level, for indicating whether the ramp voltage has reached a predetermined reference voltage level in said ramp voltage period; said comparator means including means for driving the ramp voltage to a second reference voltage level beyond said predetermined reference voltage level;
   means for receiving a calibration command;
   a ramp rate control circuit, enabled by said calibration command, to adjust the ramp voltage generator circuit to drive the ramp voltage to converge on the predetermined reference voltage level; and
   gate means, enabled by said calibration command and responsive to said comparator means, indicating that the voltage has not reached said reference voltage level, for delivering an adjustment signal to said ramp rate control circuit to adjust said ramp voltage generator circuit.

6. An automatic calibration system providing an automatic calibration process for a ramp voltage generator comprising:
   a ramp voltage generator circuit responsive to a clock signal, for providing a ramp voltage during a ramp voltage period;
   comparator means, responsive to the ramp voltage and a second reference voltage level beyond a predetermined reference voltage level, for indicating whether the ramp voltage has reached said second reference voltage level;
   means for receiving a calibration command;
   a ramp rate control circuit, enabled by said calibration command, to adjust the ramp voltage generator circuit to drive the ramp voltage to converge on the predetermined reference voltage level; and
   gate means, enabled by said calibration command and responsive to said comparator means, indicating that the ramp voltage has not reached said second reference voltage level, for delivering an adjustment signal to said ramp rate control circuit to adjust said ramp voltage generator circuit, upon convergence of said ramp voltage and said reference voltage level said gate means terminates delivery of said adjustment signal to said ramp rate control circuit thereby completing the calibration process.

* * * * *